United States Patent [19]
Ohkubo

[11] Patent Number: 5,321,641
[45] Date of Patent: Jun. 14, 1994

[54] PSEUDO RANDOM PATTERN GENERATION CIRCUIT

[75] Inventor: Chie Ohkubo, Tokyo, Japan
[73] Assignee: NEC Corporation, Tokyo, Japan
[21] Appl. No.: 982,642
[22] Filed: Dec. 1, 1992
[30] Foreign Application Priority Data
Nov. 29, 1991 [JP] Japan .................. 3-315871
[51] Int. Cl.$^5$ .............................. G06F 1/02
[52] U.S. Cl. .................................. 364/717
[58] Field of Search ............... 364/717; 371/27, 21.3
[56] References Cited
U.S. PATENT DOCUMENTS

| | | | |
|---|---|---|---|
| 5,031,130 | 7/1991 | Harada ................................ | 364/717 |
| 5,105,376 | 4/1992 | Pedron ................................ | 364/717 |
| 5,187,676 | 2/1993 | DeVane ............................... | 364/717 |
| 5,257,282 | 10/1993 | Adkisson et al. .................... | 364/717 |

Primary Examiner—David H. Malzahn
Attorney, Agent, or Firm—Whitham & Marhoefer

[57] ABSTRACT

In a pseudo random pattern generation circuit having a normal input operation mode, a boundary scanning operation mode and an inherent pseudo random pattern generation mode, output stage selectors are provided to supply input data as output data without modification in the normal input operation mode. In addition, flipflops are provided to hold the data in the boundary scanning operation mode, so that the data held in the flipflops are not supplied as output signals. Thus, in the normal input operation mode, the data processing speed is increased, and in the boundary scanning operation mode, the data just before the boundary scanning operation mode is maintained without being outputted to an internal circuit of the LSI chip.

4 Claims, 3 Drawing Sheets

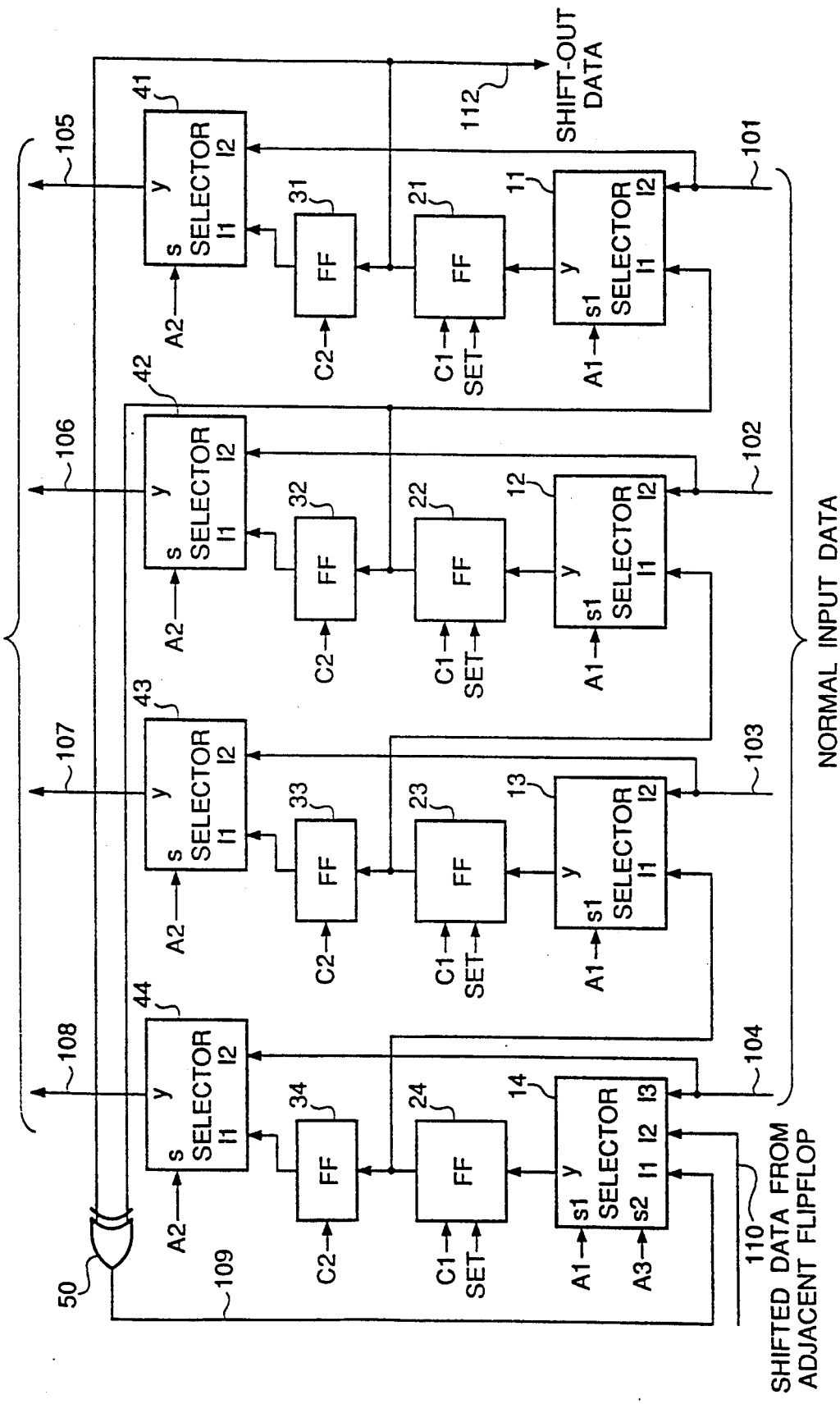

FIGURE 2

| CONTROL SIGNAL TERMINAL "s" | OUTPUT TERMINAL "y" |
|---|---|
| H | I1 |
| L | I2 |

H: HIGH LEVEL
L: LOW LEVEL

FIGURE 3

| CONTROL SIGNAL A1 | CONTROL SIGNAL A3 | OUTPUT TERMINAL "y" |
|---|---|---|
| H | H | 110 |
| H | L | 109 |
| L | L/H | 104 |

FIGURE 4

| OPERATION MODE \ SIGNAL | CONTROL SIGNAL A1 | CONTROL SIGNAL A2 | CONTROL SIGNAL A3 | CLOCK SIGNAL C1 | CLOCK SIGNAL C2 |
|---|---|---|---|---|---|
| BOUNDARY SCAN | H/L | H | H | S1 | 0 |
| PSEUDO RANDOM PATTEN GANERATION | H | H | L | S1 | S1 |
| NORMAL INPUT | L | L | L | 0 | 0 |

H: INPUT HIGH LEVEL   S1: APPLY CLOCK
L: INPUT LOW LEVEL    0: APPLY NO CLOCK

PSEUDO RANDOM PATTERN GENERATION CIRCUIT

BACKGROUND OF THE INVENTION

1. Field of the Invention

The present invention relates to a pseudo random pattern generation circuit, and more specifically to a pseudo random pattern generation circuit incorporated in a LSI (large scale integrated circuit) chip and capable of generating a test pattern which is used for checking an operation of an internal circuit within the LSI chip.

2. Description of Related Art

In the prior art, this type of pseudo random pattern generation circuits have been configured to have a normal input operation mode functioning as a buffer outputting a received input data without modification, a boundary scan mode for checking only wirings between internal circuits of the LSI chip, and a pseudo random pattern generation mode for an inherent test pattern.

For example, a typical conventional pseudo random pattern generation circuit of four bits have been comprised of four flipflops, four selectors controlled by operation mode signals so as to supply a signal to an input of the four flipflops, respectively, and an exclusive-OR gate receiving an output of selected ones of the four flipflops and outputting an signal to the selector of the most significant bit.

In the normal input operation mode, four input bits are selected by the four selectors, respectively, and outputted without modification so as to latched by the four flipflops, respectively, so that the four input bits are supplied as output data to an internal circuit of the LSI chip.

In the boundary scan mode, a data signal outputted from an adjacent boundary scan buffer is inputted through the selector of the most significant bit to the associated flipflop of the most significant bit, whose output is supplied through the selector of the second most significant bit to the associated flipflop of the second most significant bit. An output of the flipflop of the second most significant bit is supplied through the selector of the third most significant bit to the associated flipflop of the third most significant bit, whose output is supplied through the selector of the least significant bit to the associated flipflop of the least most significant bit. An output of the associated flipflop of the least most significant bit is supplied as an shifted-out data to another adjacent internal circuit of the LSI chip.

In the pseudo random pattern generation mode, the circuit operates similarly to the boundary scan mode, except that, in place of the data signal outputted from an adjacent boundary scan buffer, an output of the exclusive-OR gate is supplied through the selector of the most significant bit to the associated flipflop of the most significant bit, and the outputs of the four flipflops are outputted as the output data. Therefore, the selector of the most significant bit is of a three-input type, while the other selector is of a two-input type.

In the above mentioned pseudo random pattern generation circuit as mentioned above, when the data shifted through the flipflops in the boundary scan mode is shifted out from the circuit, the outputs of all the flipflops are outputted as the output data to the internal circuit of the LSI chip, with the result that the internal circuit is caused to operate. Because of this, the preceding internal condition cannot be maintained in the LSI chip, and therefore, after the checking, when the operation is returned to the normal operation mode, the operation is confused.

In addition, in the normal input operation mode, since the input data is transferred through the selector and the flipflop, a delay of one clock cycle occurs until the input data is outputted to the internal circuit of the LSI chip, and therefore, the processing speed lowers.

SUMMARY OF THE INVENTION

Accordingly, it is an object of the present invention to provide a pseudo random pattern generation circuit which has overcome the above mentioned defect of the conventional one.

Another object of the present invention is to provide a pseudo random pattern generation circuit which can operates with the same hardware as the pseudo random pattern generation circuit, as the boundary scan buffer and as the input buffer for the normal operation, and which has a data hold function of inhibiting change of the output data supplied to the internal circuit of the LSI chip in the boundary scan operation mode and which is capable of supplying an input data from input pads to the internal circuit of the LSI chip in the normal input operation mode.

Still another object of the present invention is to provide a pseudo random pattern generation circuit which can be constituted by regularly repeating the same circuit pattern.

The above and other objects of the present invention are achieved in accordance with the present invention by a pseudo random pattern generation circuit comprising first to Nth preceding stage flipflops each receiving set signal and a first clock signal, first to Nth succeeding stage flipflops receiving an output of the first to Nth preceding stage flipflops, respectively and each receiving a second clock signal, first to (N−1)th input stage selectors receiving at their first input an output of second to Nth flipflops of the succeeding stage flipflops, respectively, and at their second input, first to (N−1)th bits of N-bit normal input data, respectively, each of the output stage selectors being controlled by a first control signal so as to output one of the first and second inputs designated by the first control signal to the first to (N−1)th flipflops of the preceding stage flipflops, first to Nth output stage selectors receiving at their first input an output of the first to Nth succeeding stage flipflops, respectively, and first to Nth bits of normal input data at their second input, respectively, each of the output stage selectors being controlled by a second control signal so as to output one of the first and second inputs designated by the second control signal, an exclusive-OR gate receiving an output of at least two flipflops of the preceding stage flipflops, an Nth input stage selector receiving an output of the exclusive-OR gate, a shifted data outputted form an adjacent flipflop and an Nth flipflop of the preceding stage flipflops, the Nth input stage selector being controlled by the first control signal and a third control signal so as to output one of its three inputs to the Nth flipflop of the preceding stage flipflops.

According to another aspect of the present invention, there is provided a pseudo random pattern generation circuit comprising first to (N+1)th preceding stage flipflops each receiving set signal and a first clock signal, first to (N+1)th succeeding stage flipflops receiving an output of the first to (N+1)th preceding stage flipflops, respectively and each receiving a second clock signal, first to Nth input stage selectors receiving at their first input an output of second to (N+1)th flipflops of the succeeding stage flipflops, respectively, and at their second input, first to Nth bits of N-bit normal input data, respectively, each of the output stage selectors being controlled by a first control signal so as to output one of the first and second inputs designated by the first control signal to the first to Nth flipflops of the preceding stage flipflops, first to Nth output stage selectors receiving at their first input an output of the first to Nth succeeding stage flipflops, respectively, and first to Nth bits of normal input data at their second input, respectively, each of the output stage selectors being controlled by a second control signal so as to output one of the first and second inputs designated by the second control signal, an exclusive-OR gate receiving an output of at least two flipflops of the preceding stage flipflops, an (N+1)th input stage selector receiving an output of the exclusive-OR gate and a shifted data outputted form an adjacent flipflop, the (N+1)th input stage selector being controlled by a third control signal so as to output one of its two inputs to the (N+1)th flipflop of the preceding stage flipflops, and an (N+1)th output stage selector receiving the output of the exclusive-OR gate and an output of the (N+1)th flipflop of the succeeding stage flipflops, the (N+1)th output stage selector being controlled by the second control signal so as to output one of its two inputs to an external circuit.

With the above mentioned arrangement, when the second and third control signals are active and when the first clock signal is applied but the second clock signal is not applied, the circuit functions as a boundary scanning buffer and a shifted-out data is outputted from the output of the Nth flipflop of the preceding stage flipflops. In this case, since no clock signal is applied to the succeeding stage flipflops, the data shifted in the boundary scanning operation is in no way outputted to an internal circuit of the LSI chip, and the data just before the boundary scanning operation is maintained in the succeeding stage flipflops.

When the first and second control signals are active and the third control signal is inactive, and when the first clock signal and the second clock signal are applied, the circuit functions as a pseudo random pattern generation circuit. When the first to third control signals are inactive, the output stage selectors select the input data, the input data is transferred through an intermediary of no flipflop. Therefore, the circuit functions as a normal input operation circuit having no delay caused by the flipflop.

In order to generate an N-bit pseudo random pattern, the pseudo random pattern generation circuit in accordance with the second aspect of the present invention is constituted of (N+1) preceding stage and succeeding stage flipflops of the same construction and (N+1) input stage and output stage selectors of the same construction, and the (N+1)th input stage selector receives the output of the exclusive-OR gate and the output from another flipflop in the LSI chip so that one of the two is outputted to the (N+1)th preceding stage flipflop. Thus, the pseudo random pattern generation circuit can be formed by regularly arranging (N+1) unitary circuits of the same circuit construction each composed of the same flipflops and said selectors. This is very effective in simplifying the circuit construction and in preventing the delay of the operation speed.

The above and other objects, features and advantages of the present invention will be apparent from the following description of preferred embodiments of the invention with reference to the accompanying drawings.

BRIEF DESCRIPTION OF THE DRAWINGS

FIG. 1 is a circuit diagram of a first embodiment of the pseudo random pattern generation circuit in accordance with the present invention;

FIG. 2 is a table illustrating the operation of the selectors in the pseudo random pattern generation circuit shown in FIG. 1;

FIG. 3 is a table illustrating the operation of one selector in the pseudo random pattern generation circuit shown in FIG. 1;

FIG. 4 is a table illustrating the operation of the pseudo random pattern generation circuit shown in FIG. 1.

DESCRIPTION OF THE PREFERRED EMBODIMENTS

Figure 5:
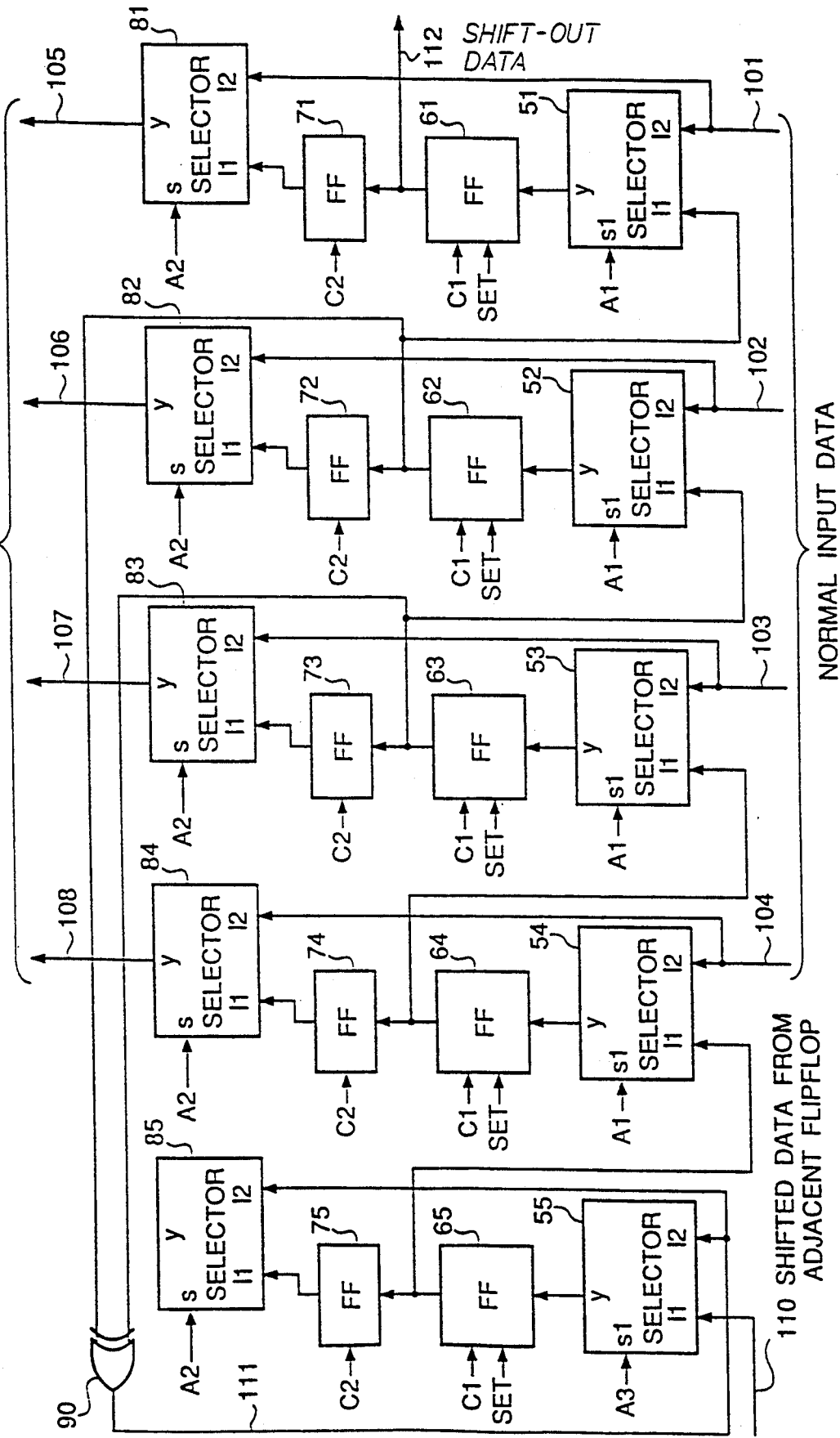
FIG. 5 is a circuit diagram of a second embodiment of the pseudo random pattern generation circuit in accordance with the present invention.

Referring to FIG. 1, there is shown a circuit diagram of a first embodiment of the pseudo random pattern generation circuit in accordance with the present invention. The shown embodiment is a four-bit pseudo random pattern generation circuit having an input of four bits and an output of four bits.

The shown embodiment includes four flipflops 21 to 24 each having a set input terminal for receiving a set signal SET and a clock terminal for receiving a first clock C1, and four flipflops 31 to 34 having their input connected to an output of the flipflops 21 to 24, respectively. The flipflops 31 to 34 have a clock terminal C2 for receiving a second clock C2. An output of the flipflops 31 to 34 are connected to a first input "I1" of four selectors 41 to 44, respectively, which have their second input "I2" connected to receive a normal input data bit 101 to 104, respectively. Each of the selectors 41 to 44 has a selection control input "s" for receiving a control signal A2, so that the four selectors 41 to 44 output, from their output "y", one of the output of the flipflops 31 to 34 and the normal input data bits 101 to 104 selected in accordance with the control signal A2, as output data bits 105 to 108 to be supplied to an internal circuit within an LSI chip.

The shown circuit also includes three selectors 11 to 13 having their first input "I1" connected to the output of the flipflops 22 to 24, and their second input "I2" connected to receive the normal input data 101 to 103, respectively. Each of the selectors 11 to 13 has a selection control input "s1" for receiving a control signal A1, so that the selectors 11 to 13 output, from their output "y", one of the output of the flipflops 22 to 24 and the normal input data bit 101 to 103 selected in accordance with the control signal A1, to an input of the flipflops 21 to 23, respectively. An exclusive-OR gate 50 has its inputs connected to the output of at least two flipflops of the four flipflops 21 to 24. An output 109 of the exclusive-OR gate 50 is connected to a first input "I1" of a three-input selector 14, which has its second input "I2" connected to receive a shifted data bit outputted from an adjacent flipflop (not shown) and its third input connected to receive the normal input data bit 104. The selector 14 has a first selection control input "s1" for receiving the control signal A1 and a second selection control input "s2" for receiving a control signal A3, so that one of the three inputs "I1", "I2" and "I3" is selected and outputted to an input of the flipflop 24.

Referring to FIG. 2, there is shown a table illustrating an operation of the selectors 11 to 13 and 41 to 44 in the circuit shown in FIG. 1. When a high level signal (H) is applied to the selection control input, each selector outputs the signal inputted to the first input "I1", and when a low level signal (L) is applied to the selection control input, each selector outputs the signal inputted to the second input "I2".

Referring to FIG. 3, there is shown a table illustrating an operation of the selector 14 in the circuit shown in FIG. 1. When the control signal A1 is at the high level signal (H) and the control signal A3 is also at the high level signal (H), the selector 14 outputs the signal 110. When the control signal A1 is at the high level signal (H) and the control signal A3 is at the low level signal (L), the selector 14 outputs the signal 109. When the control signal A1 is at the low level signal (L) the selector 14 outputs the signal 104, regardless of the level of the control signal A3.

Referring to FIG. 4 which is a table illustrating the operation of the pseudo random pattern generation circuit shown in FIG. 1, there will be described that, on the basis of the control signals A1, A2 and A3, the pseudo random pattern generation circuit shown in FIG. 1 can perform three kinds of operation, namely, the boundary scan operation, the pseudo random pattern generation and the normal input operation.

When the control signals A2 and A3 are at the high level and the clock signal C1 is applied but the clock signal C2 is not applied, the circuit operates as a buffer for the boundary scanning. In this mode, when the control signal A1 is at the high level, the values latched in the flipflops 22 to 24 are outputted and selected by the selectors 11 to 13 so as to be latched in the flipflops 21 to 23. In addition, the output signal 110 from the adjacent flipflop (not shown) is selected by the selector 14 and latched in the flipflop 24. With this operation, the scanning data is shifted and outputted from the output of the flipflop 21 as the shifted-out data to an adjacent circuit in the LSI chip. At this time, since the clock signal C2 is not generated, the output of the flipflops 21 to 24 are not latched into the flipflops 31 to 34, and therefore, the flipflops 31 to 34 maintain their current output values, which are selected by the selectors 41 to 44. The output bits 105 to 108 to be supplied to the internal circuit within the LSI chip are maintained without modification.

When the control signal A1 is at the low level, the normal input data bits 101 to 104 are selected by the selectors 11 to 14 and therefore latched in the flipflops 21 to 24. Even at this time, however, the output bits 105 to 108 to be supplied to the internal circuit within the LSI chip are maintained without modification.

When the control signals A1 and A2 at the high level and the control signal A3 is at the low level and when the clock signals C1 and C2 are supplied, the circuit operates as the pseudo random pattern generation circuit. The values latched in the flipflops 22 to 24 are outputted and selected by the selectors 11 to 13 so as to be latched in the flipflops 21 to 23, and on the other hand, the output signal 109 of the exclusive-OR gate 50 is selected by the selector 14 and latched in the flipflop 24. Thus, a linear feed-back shift register is formed. At this time, in response to the clock signal C2, the flipflops 31 to 34 latch the output of the flipflops 21 to 24 which constitutes a pseudo random pattern, and the output of the flipflops 31 to 34 are selected by the selectors 41 to 44, so that the output bits 105 to 108 to be supplied to the internal circuit within the LSI chip become the pseudo random pattern.

When the control signals A1, A2 and A3 are at the low level and the clock signals C1 and C2 are not supplied, the circuit performs a normal input operation. The normal input data bits 101 to 104 are selected by the selectors 11 to 14, but since no clock signal is applied to the flipflops 21 to 24 and 31 to 34, the output status of these flipflops does not change. On the other hand, the normal input data bits 101 to 104 are selected by the selectors 41 to 44, and outputted as the output bits 105 to 108 to be supplied to the internal circuit within the LSI chip.

Referring to FIG. 5, there is shown a circuit diagram of a second embodiment of the pseudo random pattern generation circuit in accordance with the present invention. The second embodiment is a four-bit pseudo random pattern generation circuit having an input of four bits and an output of four bits, similarly of the first embodiment.

The second embodiment includes five flipflops 61 to 65 each having a set input terminal for receiving a set signal SET and a clock terminal for receiving a first clock C1, and five flipflops 71 to 75 having their input connected to an output of the flipflops 61 to 65, respectively. The flipflops 71 to 75 have a clock terminal C2 for receiving a second clock C2. An output of the flipflops 71 to 74 are connected to a first input "I1" of selectors 81 to 84, respectively, which have their second input "I2" connected to receive a normal input data bit 101 to 104, respectively. Each of the selectors 81 to 84 has a selection control input "s" for receiving a control signal A2, so that the selectors 81 to 84 output, from their output "y", one of the output of the flipflops 71 to 74 and the normal input data bits 101 to 104 selected in accordance with the control signal A2, as output data bits 105 to 108 to be supplied to an internal circuit within an LSI chip.

The second embodiment also includes selectors 51 to 54 having their first input "I1" connected to the output of the flipflops 62 to 65, and their second input "I2" connected to receive the normal input data 101 to 104, respectively. Each of the selectors 51 to 54 has a selection control input "s1" for receiving a control signal A1, so that the selectors 51 to 54 output, from their output "y", one of the output of the flipflops 62 to 65 and the normal input data bit 101 to 104 selected in accordance with the control signal A1, to an input of the flipflops 61 to 64, respectively. An exclusive-OR gate 90 has its inputs connected to the output of at least two flipflops of the four flipflops 61 to 65. An output 111 of the exclusive-OR gate 90 is connected to a first input "I1" of a selector 55, which has its second input "I2" connected to receive a shifted data bit 110 outputted from an adjacent flipflop (not shown). The selector 55 has a selection control input "s1" for receiving a control signal A3, so that one of the output 111 and the shifted data bit 110 is selected and outputted to an input of the flipflop 65. Furthermore, the output of the flipflop 75 and the output 111 of the exclusive-OR gate 90 are supplied to inputs "I1" and "I2" of a selector 85, which is controlled by the control signal A2 so as to output a selected one of the output of the flipflop 75 and the output 111 of the exclusive-OR gate 90. In FIG. 5, an output "y" of the selector 85 is connected to none of the elements shown, but can be connected to one input of the exclusive-OR gate 90 as mentioned hereinbefore.

In the second embodiment, operation of the selectors 51 to 54 and 81 to 84 are the same as those of the selectors 11 to 13 and 41 to 44 shown in FIG. 1.

Now, an operation of the second embodiment will be described with reference to FIG. 4.

When the control signals A2 and A3 are at the high level and the clock signal C1 is applied but the clock signal C2 is not applied, the circuit operates as a buffer for the boundary scanning. In this mode, when the control signal A1 is at the high level, the values latched in the flipflops 62 to 65 are outputted and selected by the selectors 51 to 54 so as to be latched in the flipflops 61 to 64. The output signal 110 from the adjacent flipflop (not shown) is selected by the selector 55 and latched in the flipflop 65. With this operation, the scanning data is shifted and outputted from the output of the flipflop 61 as the shifted-out data 112 to an adjacent circuit in the LSI chip. At this time, since the clock signal C2 is not generated, the output of the flipflops 61 to 65 are not latched into the flipflops 71 to 75, and therefore, the flipflops 71 to 75 maintain their current output values, which are selected by the selectors 81 to 85. The output bits 105 to 108 to be supplied to the internal circuit within the LSI chip are maintained without modification.

When the control signal A1 is at the low level, the normal input data bits 101 to 104 are selected by the selectors 51 to 54 and therefore latched in the flipflops 61 to 64. Even at this time, however, the output bits 105 to 108 to be supplied to the internal circuit within the LSI chip are maintained without modification.

When the control signals A1 and A2 at the high level and the control signal A3 is at the low level and when the clock signals C1 and C2 are supplied, the circuit operates as the pseudo random pattern generation circuit. The values latched in the flipflops 62 to 65 are outputted and selected by the selectors 51 to 54 so as to be latched in the flipflops 61 to 64, and on the other hand, the output signal 111 of the exclusive-OR gate 90 is selected by the selector 55 and latched in the flipflop 65. Thus, a linear feed-back shift register is formed. At this time, the flipflops 71 to 75 latch the output of the flipflops 61 to 65 which constitutes a pseudo random pattern, and the output of the flipflops 71 to 75 are selected by the selectors 81 to 85, so that the output bits 105 to 108 to be supplied to the internal circuit within the LSI chip become the pseudo random pattern.

When the control signals A1, A2 and A3 are at the low level and the clock signals C1 and C2 are not supplied, the circuit performs a normal input operation. The normal input data bits 101 to 104 are selected by the selectors 51 to 54 and the output 111 of the exclusive-OR gate 90 is selected by the selector 55, but since no clock signal is applied to the flipflops 61 to 65 and 71 to 75, the output status of these flipflops does not change. On the other hand, the normal input data bits 101 to 104 are selected by the selectors 81 to 84, and outputted as the output bits 105 to 108 to be supplied to the internal circuit within the LSI chip. In this condition, the output 111 of the exclusive-OR gate 90 is selected by the selector 85, but the output of the selector 85 is supplied anywhere.

The second embodiment is larger than the first embodiment in the number of circuit elements, but the whole circuit is constituted of the same unitary circuits. This is very advantageous in manufacturing the circuit. In addition, the second embodiment can obtain an operation speed which is higher than the first embodiment.

As will be apparent from the above, the pseudo random pattern generation circuit in accordance with the present invention can operates with the same hardware as the pseudo random pattern generation circuit, as the boundary scan buffer and as the input buffer for the normal operation, and has a data hold function of inhibiting change of the output data supplied to the internal circuit of the LSI chip in the boundary scan operation mode. Therefore, the confusion in the operation of the internal circuits of the LSI chip can be prevented. In addition, since the pseudo random pattern generation circuit in accordance with the present invention is capable of supplying an input data from input pads to the internal circuit of the LSI chip in the normal input operation mode, the processing speed can be increased.

The invention has thus been shown and described with reference to the specific embodiments. However, it should be noted that the present invention is in no way limited to the details of the illustrated structures but changes and modifications may be made within the scope of the appended claims.

I claim:

1. A pseudo random pattern generation circuit comprising first to Nth preceding stage flipflops each receiving set signal and a first clock signal, first to Nth succeeding stage flipflops receiving an output of said first to Nth preceding stage flipflops, respectively and each receiving a second clock signal, first to (N−1)th input stage selectors receiving at their first input an output of second to Nth flipflops of said preceding stage flipflops, respectively, and at their second input, first to (N−1)th bits of N-bit normal input data, respectively, each of said input stage selectors being controlled by a first control signal so as to output one of the first and second inputs designated by said first control signal to the first to (N−1)th flipflops of said preceding stage flipflops, first to Nth output stage selectors receiving at their first input an output of said first to Nth succeeding stage flipflops, respectively, and first to Nth bits of normal input data at their second input, respectively, each of said output stage selectors being controlled by a second control signal so as to output one of the first and second inputs designated by said second control signal, an exclusive-OR gate receiving an output of at least two flipflops of said preceding stage flipflops, an Nth input stage selector receiving an output of said exclusive-OR gate, a shifted data outputted form an adjacent flipflop and the Nth bit of normal input data, said Nth input stage selector being controlled by said first control signal and a third control signal so as to output one of its three inputs to the Nth flipflop of said preceding stage flipflops.

2. a pseudo random pattern generation circuit claimed in claim 1 wherein when said second and third control signals are active and when said first clock signal is applied but said second clock signal is not applied, the circuit functions as a boundary scanning buffer and a shifted-out data is outputted from the output of the Nth flipflop of said preceding stage flipflops, wherein when said first and second control signals are active and said third control signal is inactive, and when said first clock signal and said second clock signal are applied, the circuit functions as a pseudo random pattern generation circuit, and wherein when said first to third control signals are inactive, the circuit functions as a normal input operation circuit.

3. A pseudo random pattern generation circuit comprising first to (N+1)th preceding stage flipflops each receiving set signal and a first clock signal, first to (N+1)th succeeding stage flipflops receiving an output of said first to (N+1)th preceding stage flipflops, respectively and each receiving a second clock signal, first to Nth input stage selectors receiving at their first input an output of second to (N+1)th flipflops of said preceding stage flipflops, respectively, and at their second input, first to Nth bits of N-bit normal input data, respectively, each of said input stage selectors being controlled by a first control signal so as to output one of the first and second inputs designated by said first control signal to the first to Nth flipflops of said preceding stage flipflops, first to Nth output stage selectors receiving at their first input an output of said first to Nth succeeding stage flipflops, respectively, and first to Nth bits of normal input data at their second input, respectively, each of said output stage selectors being controlled by a second control signal so as to output one of the first and second inputs designated by said second control signal, an exclusive-OR gate receiving an output of at least two flipflops of said preceding stage flipflops, an (N+1)th input stage selector receiving an output of said exclusive-OR gate and a shifted data outputted form an adjacent flipflop, said (N+1)th input stage selector being controlled by a third control signal so as to output one of its two inputs to the (N+1)th flipflop of said preceding stage flipflops, and an (N+1)th output stage selector receiving said output of said exclusive-OR gate and an output of the (N+1)th flipflop of said succeeding stage flipflops, said (N+1)th output stage selector being controlled by said second control signal so as to output one of its two inputs to an external circuit.

4. A pseudo random pattern generation circuit claimed in claim 3 wherein when said second and third control signals are active and when said first clock signal is applied but said second clock signal is not applied, the circuit functions as a boundary scanning buffer and a shifted-out data is outputted from the output of the first flipflop of said preceding stage flipflops, wherein when said first and second control signals are active and said third control signal is inactive, and when said first clock signal and said second clock signal are applied, the circuit functions as a pseudo random pattern generation circuit, and wherein when said first to third control signals are inactive, the circuit functions as a normal input operation circuit.

* * * * *